United States Patent [19]

Savignac et al.

[11] Patent Number: 5,592,063

[45] Date of Patent: Jan. 7, 1997

[54] VOLTAGE GENERATOR CIRCUIT

[75] Inventors: Dominique Savignac, Ismaning; Dieter Gleis, Grosskarolinenfeld; Manfred Menke, München, all of Germany

[73] Assignee: Siemens Aktiengesellschaft, Munich, Germany

[21] Appl. No.: 279,918

[22] Filed: Jul. 25, 1994

[30] Foreign Application Priority Data

Jul. 23, 1993 [DE] Germany .......................... 43 24 853.5

[51] Int. Cl.$^6$ .................................................. G11C 5/10
[52] U.S. Cl. .................................................. 320/1; 365/222
[58] Field of Search ............................. 365/226, 227, 365/228, 149; 320/1; 369/150, 151; 327/536

[56] References Cited

U.S. PATENT DOCUMENTS

| | | | |
|---|---|---|---|
| 4,794,278 | 12/1988 | Vajdic | 327/536 |
| 5,168,174 | 12/1992 | Naso et al. | 327/536 |
| 5,267,201 | 11/1993 | Foss et al. | 365/226 |
| 5,297,104 | 3/1994 | Nakashima | 365/230.06 |
| 5,349,559 | 9/1994 | Park et al. | 365/226 |
| 5,418,751 | 5/1995 | Kaiser | 365/226 |
| 5,446,697 | 8/1995 | Yoo et al. | 365/226 |

OTHER PUBLICATIONS

IEEE Journal of Solid–State Circuits, vol. 26, No. 4 Apr. 1991 (Nakagome et al.) "An Experimental 1.5–V 64–Mb DRAM" pp. 465–472.

*Primary Examiner*—Robert Nappi
*Assistant Examiner*—Patrick B. Law
*Attorney, Agent, or Firm*—Herbert L. Lerner; Laurence A. Greenberg

[57] ABSTRACT

A voltage generator circuit includes a storage capacitor with a terminal for pickup of an output voltage. A voltage generator device which can be turned on and off has an output being connected to the terminal of the storage capacitor. A first comparator device which can be turned on and off compares the output voltage with a first threshold voltage and generates a signal for turning the voltage generator device on and off. A second comparator device compares the output voltage with a second threshold voltage and generates an output signal with which the first comparator device is turned on and off.

8 Claims, 5 Drawing Sheets

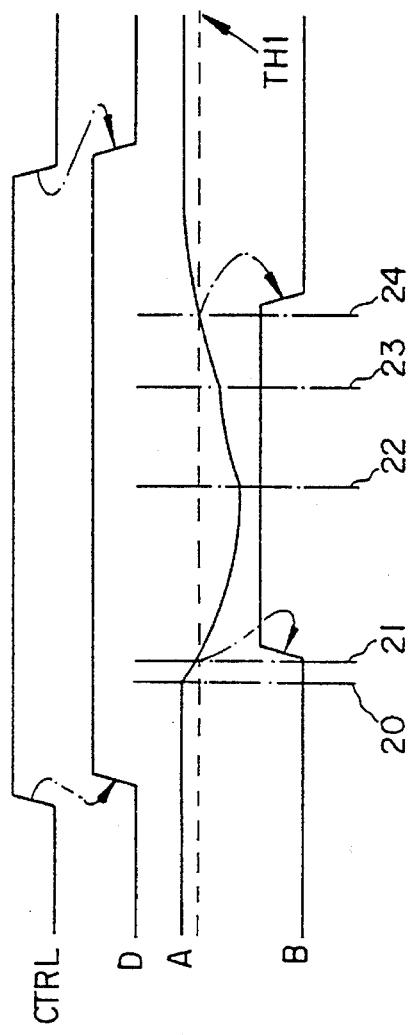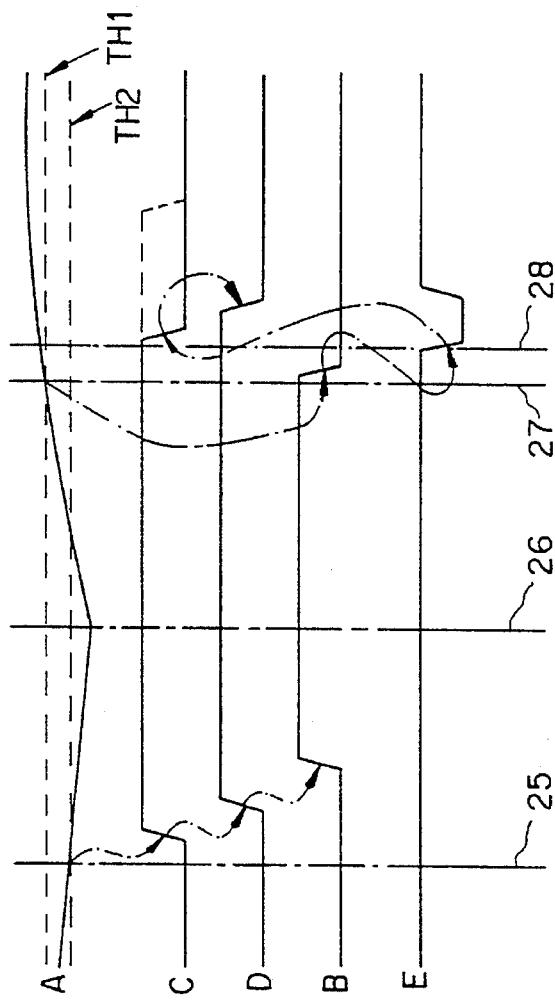

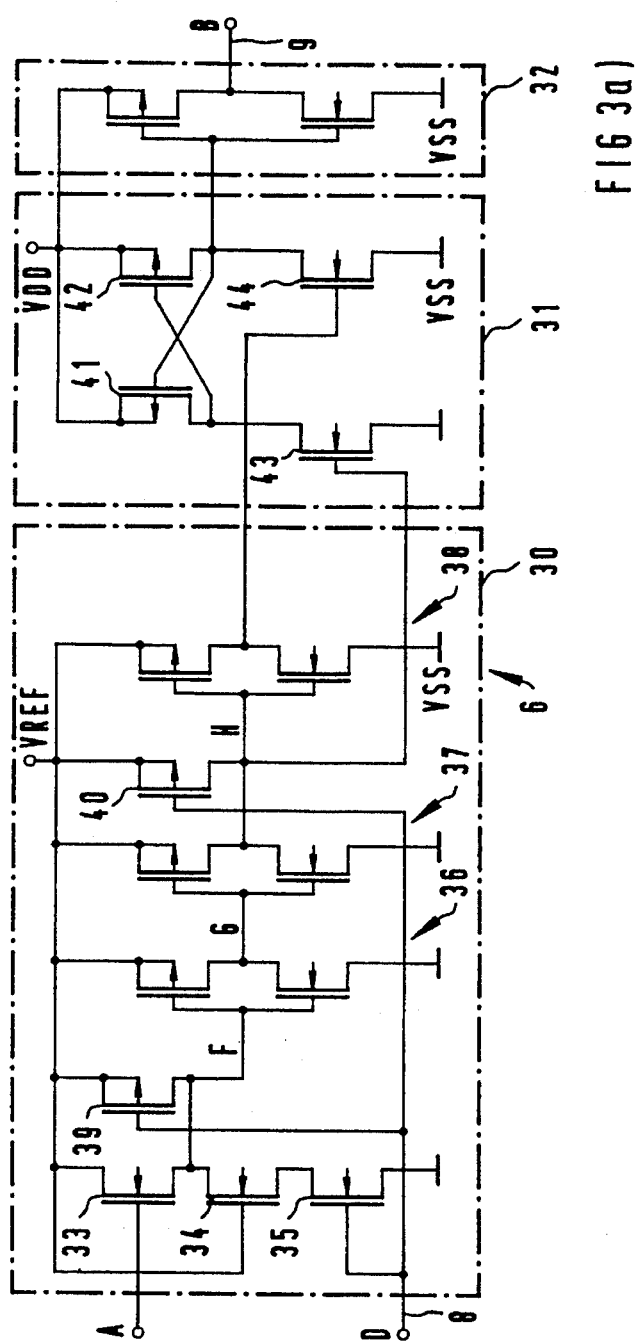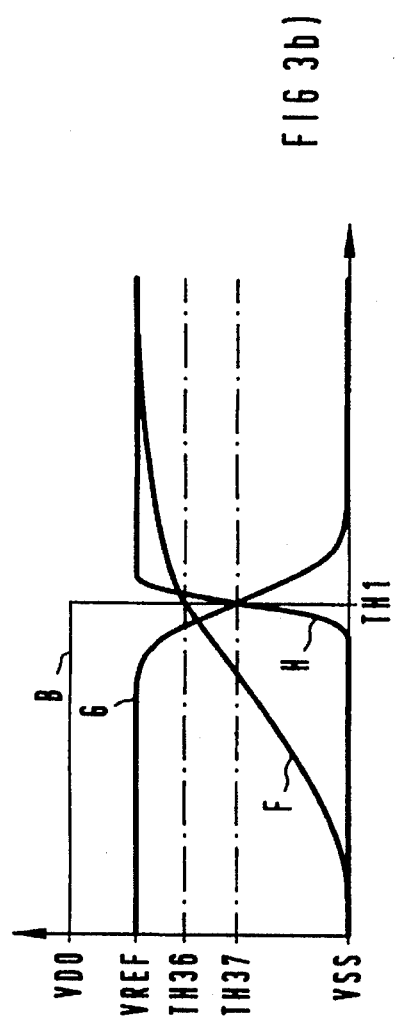
FIG 3a)
FIG 3b)

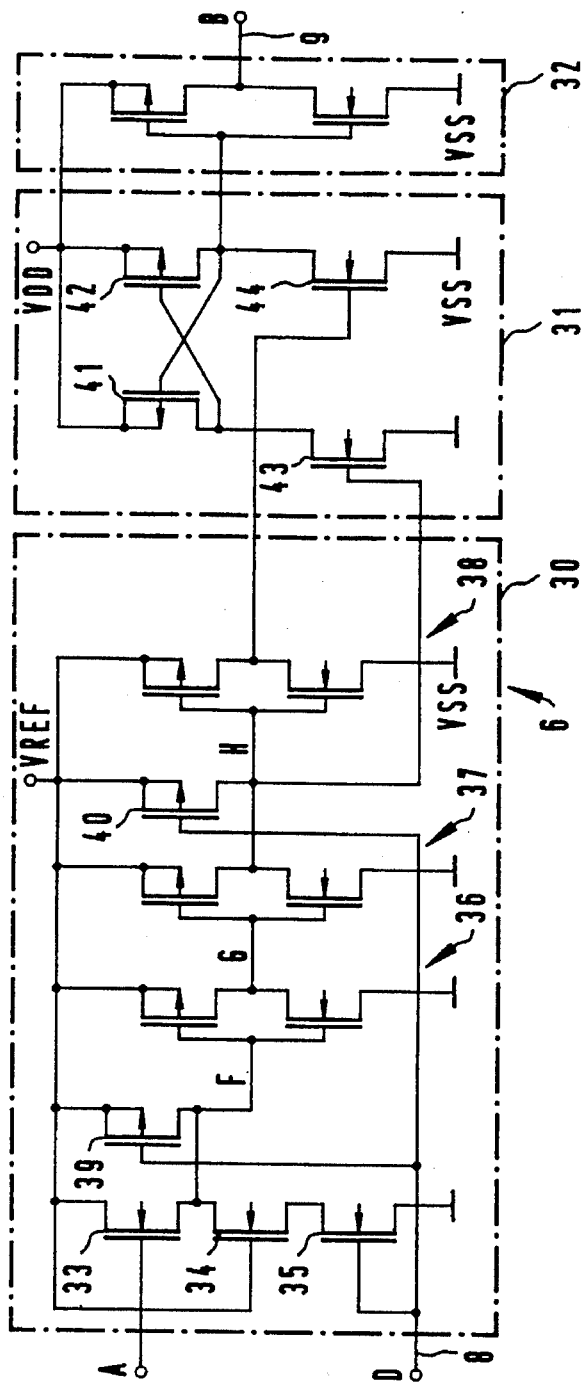
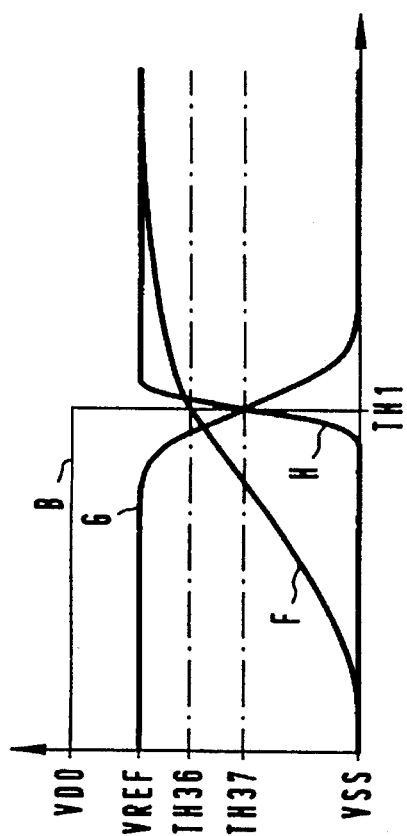
FIG 3a)
FIG 3b)

VOLTAGE GENERATOR CIRCUIT

BACKGROUND OF THE INVENTION

Field of the Invention

The invention relates to a circuit for generating a further voltage from a supply voltage.

The further voltage may be greater or less than the supply voltage. Such voltage generator circuits are often used in integrated circuits in order to supply certain parts of the circuit with an operating or control voltage that differs from the supply voltage to the integrated circuit. For example, in dynamic semiconductor memories (DRAMs) with a memory cell that includes a selection transistor and a storage capacitor, the selection transistor may be an n-channel MOS transistor. In order to enable reliable writing of the information to be stored, the trigger voltage of a word line, by which the gate terminal of the selection transistor is controlled, must be above the supply voltage. For the sake of reliability, that increased voltage must moreover not exceed a maximum value. Circuits for voltage generation are also used if, for instance for reasons of standardization, circuits are supplied with a fixed supply voltage (such as 5 V), yet the internal circuits are operated at a reduced operating voltage (such as 3.3 V).

In order to generate the increased word line voltage in DRAMs, booster circuits are known which operate by the principle of charge displacement. The high voltage is generated by slide capacitors that are precharged in the resting phase of the DRAMs. However, a disadvantage of such boosters is that the slide capacitors are charged and discharged completely upon each operating cycle. Since the increased voltage must be reliably generated in the fluctuating range of the supply voltage, the slide capacitors must be constructed for the lower limit of the fluctuation range. They are accordingly relatively large and thus consume a great deal of power. Limiting the maximum word line voltage for a supply voltage at the upper fluctuation range, moreover requires complicated circuits.

In an article entitled "An Experimental 1.5-V 64-Mb DRAM" by Y. Nakagome, in the IEEE Journal of Solid-State Circuits, Vol. 26, No. 4, April 1991, a charge pump is used to generate the increased voltage. The word lines are charged from the storage capacitor by charge transfer in the reading or writing phase and are brought to the increased level with a smaller, two-stage charge slider. No provisions with which the maximal voltage could be limited are shown.

SUMMARY OF THE INVENTION

It is accordingly an object of the invention to provide a voltage generator circuit, which overcomes the hereinafore-mentioned disadvantages of the heretofore-known devices of this general type, which generates a further voltage from a supply voltage and in which the further voltage is generated regardless of fluctuations in the supply voltage. The circuit should work reliably in the fluctuation range of the supply voltage and should consume little power.

With the foregoing and other objects in view there is provided, in accordance with the invention, a voltage generator circuit, comprising a storage capacitor with a terminal for pickup of an output voltage; a voltage generator device to be turned on and off, the voltage generator device having an output being connected to the terminal of the storage capacitor; a first comparator device to be turned on and off, the first comparator device comparing the output voltage with a first threshold voltage and generating a signal for turning the voltage generator device on and off; and a second comparator device for comparing the output voltage with a second threshold voltage and generating an output signal with which the first comparator device is turned on and off.

In accordance with another feature of the invention, there is provided a logical linking member linking the output signal of the second comparator device to a control signal, the logical linking member supplying an output signal turning the first comparator device on and off.

In accordance with a further feature of the invention, the first comparator device has a shorter signal delay time than the second comparator device; the first threshold voltage is lower than the second threshold voltage; and including an edge detector receiving the output signal of the first comparator device and generating a pulse resetting the second comparator device upon a signal edge turning off the voltage generator device.

In accordance with an added feature of the invention, each of the comparator devices respectively includes a comparison stage being supplied by a reference potential and a first supply potential; a level converter device being supplied by the first supply potential and a second supply potential and having and output, the level converter device converting output signal levels of the comparison stage to one of the supply potentials; and an amplifier stage connected downstream of the output of the level converter device.

In accordance with an additional feature of the invention, the comparison stage includes a first n-channel MOS transistor having a source terminal, a drain terminal being connected to the reference potential and a gate terminal being controlled by the output voltage; a second n-channel MOS transistor having a drain-to-source path being connected between the source terminal of the first n-channel MOS transistor and the first supply potential and having a gate terminal being connected to the reference potential; and at least one amplifier stage having an input being connected to the source terminal of the first n-channel MOS transistor.

In accordance with yet another feature of the invention, there is provided a p-channel MOS transistor being connected between the input of the amplifier stage and the reference potential, the p-channel MOS transistor having a gate terminal being controlled by a signal for resetting.

In accordance with yet a further feature of the invention, there is provided another n-channel MOS transistor connecting the second n-channel MOS transistor of the comparison stage to the first supply potential, the other n-channel MOS transistor having a gate terminal being controlled by a signal for turning the comparator device on and off.

In accordance with yet an added feature of the invention, the voltage generator device includes an oscillator to be turned on and off by a signal and a pump circuit being controlled by the oscillator.

In accordance with a concomitant feature of the invention, the voltage generator device includes an MOS transistor having a drain-to-source path being connected between the second supply potential and the terminal of the storage capacitor and having a gate terminal being controlled by the output signal of the first comparator device.

In order to generate an output voltage that is above the supply voltage, a charge pump can be used. In order to generate a reduced output voltage, an actively regulated MOS transistor can be used. The first comparator device suitably has a short delay period and can be turned off. Since fast comparator circuits typically consume relatively great amounts of power, it is provided that they are turned off during an inactive phase. The second comparator device suitably has a relatively long delay time, but in return consumes little power and remains on all the time. This enables an economical mode of operation in terms of power loss.

The comparator devices are constructed in such a way that their input-side comparison stage is supplied with a reference voltage. As a result, a comparison threshold that is independent of fluctuations in the supply voltage to the integrated circuit can be established.

Other features which are considered as characteristic for the invention are set forth in the appended claims.

Although the invention is illustrated and described herein as embodied in a voltage generator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2a through 2(i) are timing diagrams of relevant signals;

FIG. 3a is a schematic circuit diagram of a first comparator;

FIG. 3b is a static characteristic curve diagram associated with FIG. 3a;

FIG. 5 is a schematic and block diagram of an edge detector; and

FIG. 6 is a schematic diagram of a circuit for generating a reduced voltage.

DESCRIPTION OF THE PREFERRED EMBODIMENTS

Figure 1:
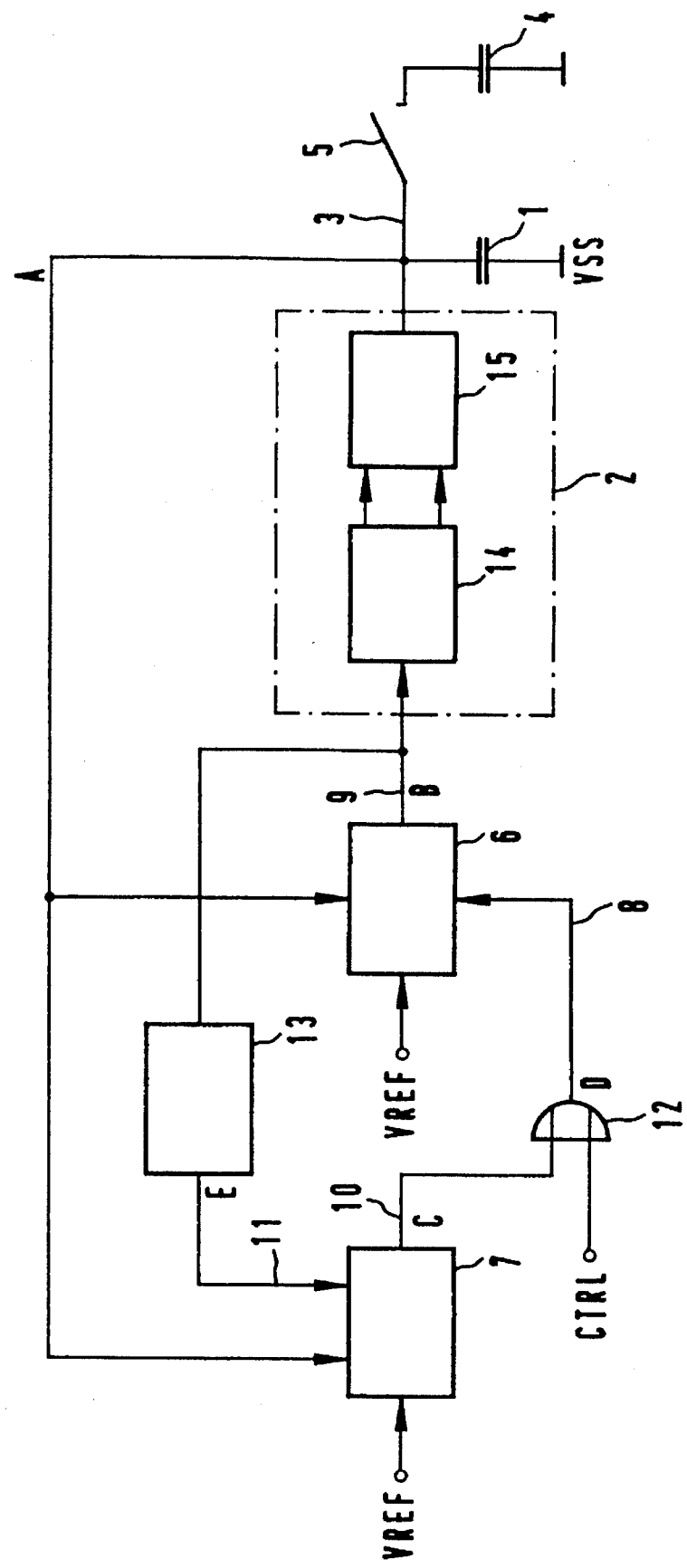
FIG. 1 is a basic schematic and block diagram of a circuit for generating an increased voltage.

Referring now to the figures of the drawing in detail and first, particularly, to FIG. 1 thereof, there is seen a charge pump 2 which is used to generate an increased voltage and with which a storage capacitor 1 is charged. One electrode of the storage capacitor 1 is at reference potential VSS (ground), while the other electrode 3 is connected to one output of the charge pump 2. The circuit shown in FIG. 1 is suitable in particular for generating an increased word line signal voltage in DRAMs. The storage capacitor 1 is essentially formed of a tub capacitor of a word line path and it therefore does not need to be constructed as a further capacitor on a chip. During an active writing or reading phase, one or more selected word lines are supplied with the increased voltage from the storage capacitor 1. This is represented in FIG. 1 by showing the terminal 3 of the storage capacitor 1, which terminal carries the increased voltage, being connected to an effective capacitor 4 of the selected word lines through a switch 5. Any charge pump that can be turned off can be used as the charge pump 2. A charge pump that includes an oscillator 14 which can be turned off and that generates the required periodic signals for controlling a pump circuit 15 has proved to be advantageous. The pump circuit 15 can suitably be made up of two identical halves that are controlled in the push-pull mode.

An output voltage A at the terminal 3 is carried to a first comparator 6 and a second comparator 7. The output voltage A is compared in each of the comparators 6, 7 with a respective comparison threshold. The comparison threshold of the comparator 6 is somewhat higher than the comparison threshold of the comparator 7. In order to set the comparison thresholds independently of the supply voltage, a reference voltage VREF is supplied to the comparators 6, 7. The comparators 6, 7 have respective outputs 9, 10 at which they generate a logical H level if the voltage to be compared is below the respective comparison threshold, and an L level if the voltage to be compared is above the comparison threshold. The comparator 6 is dimensioned in such a way that it has a slight switching delay and it therefore uses up a relatively high power loss. The comparator 6 and therefore its power consumption can be turned off through a control input 8. The comparator 7 uses up a little power loss, and therefore its switching delay is relatively long. The comparator 7 can be reset through a control input 11. The output 10 of the comparator 7 is connected to the control input 8 of the comparator 6. A control signal CTRL is coupled to the control input 8 of the comparator 6 through a logical link 12, which is suitably an OR link in this case. The output 9 of the comparator 6 is connected to the control input 11 of the comparator 7 through an edge detector 13. The charge pump 2 is turned on and off with the output 9 of the comparator 6.

The mode of operation of the circuit shown in FIG. 1 is described below, by taking signal diagrams shown in FIG. 2 as examples. The courses of operation differ in an active writing or reading phase and in a resting phase. The active phase is indicated by an H level of the signal CTRL, which is produced at the proper time in the DRAM in order to control the switch 5. During that phase, the charge outflow from the storage capacitor 1 into the word line capacitor 4 has to be compensated for as quickly as possible. The corresponding signals are shown in FIGS. 2(a) through 2(d). During the resting phase, essentially leakage currents lead to a voltage drop at the storage capacitor 1. This voltage drop is also compensated for, so that at the beginning of an active phase the entire increased voltage is available. The signal sequence for compensating for this voltage drop is shown in FIGS. 2(e) through 2(i).

During an active writing or reading phase shown in FIGS. 2(a) through 2(d), the comparator 6 is turned on by the signal CTRL and through an output signal D of the OR switching element 12. At a time 20, a charge transfer from the storage capacitor 1 to the word line capacitor 4 begins. The output voltage A at the terminal 3 drops, and at a time 21 it drops below a switching threshold TH1 of the comparator 6. The comparator 6 has a short delay time, so that immediately after the time 21, an output signal B of the comparator 6 becomes active. As a result, the charge pump 2 is turned on. Through the use of the charge pump, the output voltage A is increased, for instance with two pumping strokes at times 22, 23, until at a time 24 it exceeds the switching threshold TH1 of the comparator 6. The output signal B of the comparator 6 is thereupon reset to L, causing the charge pump 2 to be turned off. At the time 24, the charge transfer from the storage capacitor 1 to the word line capacitor 4 has also already ended, so that the output voltage A remains at the existing level. The ratio between the storage capacitor 1 and the word line capacitor 4 is adjusted in typical DRAMs with a 5-volt supply voltage, in such a way that the voltage A would drop at most by 0.5 V after a complete charge compensation. Access to the memory can thus be initiated immediately after the beginning of the active phase. In order to restore the increased level of the output voltage A, the pump is available for the duration of the entire active phase. It can therefore be dimensioned to be relatively small, thus avoiding major disruptive current peaks.

During the resting phase of the DRAMs shown in FIGS. 2(e) through 2(i), the comparator 6 is normally turned off by the L level of the signal CTRL. This reduces the power takeup of the entire circuit. The comparator 7 is turned on permanently. It consumes little power, but by comparison with the comparator 6 it has a longer delay time. A switching threshold TH2 of the comparator 7 is somewhat below the switching threshold TH1 of the comparator 6.

Due to leakage currents, the output voltage A drops, and at a time 25 it drops below the switching threshold TH2 of the comparator 7. After the delay time of the comparator 7, its output signal C becomes active. As a result, the comparator 6 is turned on through the signal D. Since the switching threshold TH1 of the comparator 6 is above the switching threshold TH2 of the comparator 7, the output signal B of the comparator 6 is also switched to be active. The charge pump 2 is turned on and at a time 26 it begins a pumping stroke. When the output voltage A exceeds the switching threshold TH1 of the comparator 6 at a time 27, the output signal B of the comparator 6 is switched over to the L level. The charge pump 2 is switched off as a result. Due to the slower switching behavior of the comparator 7, its output signal C continues to be at the H level, even though by then the output signal A is above its switching threshold TH2. In order to ensure that the comparator 6, which has high current consumption, can be switched off rapidly, the trailing edge of the output signal B of the comparator 6 is detected in the edge detector 13. A pulse for resetting the comparator 7 is generated from a time 28 on in an output signal E of the edge detector 13. The pulse duration is selected in such a way that internal nodes of the comparator 7 are reliably turned off, so that its output signal C is reset to the L level. As a result, the signal D is also reset, so that the comparator 6 is turned off in order to reduce the power consumption. The signal E is L-active in this exemplary embodiment. In other words, the pulse generated by the edge detector 13 has an L level. If no edge is detected, then the signal E is at an H level.

Depending on the sensitivity and the delay time of the comparators 6, 7, the increased output voltage A is near the switching thresholds TH1 and TH2 of the comparators. For the sake of dynamic regulation in the DRAM, a control width of 0.2 V is adequate. The charge pump 2 is dimensioned in such a way that at the lower limit of fluctuation of the supply voltage, it reaches the necessary level for the increased voltage A during an active phase after preferably two pumping strokes.

An embodiment in terms of circuitry for the comparator 6 is shown in FIG. 3a together with static characteristic curves in FIG. 3b. On the input side, the comparator includes a comparison stage 30, which is supplied with the reference potential VSS and the reference potential VREF on the supply voltage side. The comparison stage 30 is followed by a level converter device 31, which is supplied by the reference potential VSS and a supply potential VDD. An output signal of the level converter 31 is amplified in an amplifier stage 32.

The comparison stage 30 has the following layout, which is described below in detail. An input side of the comparison stage 30 includes three MOS transistors 33, 34, 35, which are connected in series by their drain-to-source paths and which are located between the potentials VREF and VSS. The first transistor 33 is controlled by the signal A, the other transistor 35 by the signal D, and the second transistor 34 by the potential VREF. An inverter 36 that is followed by two further inverters 37, 38 is connected to a junction between the transistors 33, 34. A switching threshold TH37 of the inverter 37 is lower than a switching threshold TH36 of the inverter 36. Preferably the switching threshold TH37 is approximately in the middle between the potentials VREF and VSS. One P-channel MOS transistor 39, 40, which is controlled by the signal D, is connected between the input of each respective inverter 36, 38 and the reference potential VREF.

The level converter 31 is a cross-coupled level converter with two current paths, each containing one n-channel and one p-channel MOS transistor, between the supply potentials VDD and VSS. P-channel MOS transistors 41, 42 are disposed on the side of the supply potential VDD and are cross-coupled. N-channel MOS transistors 43, 44 are controlled by complementary signals, namely output signals of the inverters 37 and 38. On the output side, the level inverter 31 is followed by an inverter as the amplifier stage 32. The inverter 32 is supplied by the same supply voltage as the level converter 31. An output of the inverter 32 is the output 9 of the comparator 6 that carries the signal B. Preferably, the comparison stage 30 is supplied from a separate, undisturbed supply potential source VSS, which is independent of the supply potential source VSS for the level converter 31 and the amplifier stage 32. Due to the calm potential VSS and the reference potential VREF which is independent of fluctuations in the supply potentials VSS, VDD, a relatively accurate comparison of the signal A with the switching threshold TH1 of the comparator 6 can be attained.

The comparator 6 can be turned on and off by the signal D. If the signal D carries an L level, then the transistor 35 is blocked and the transistors 39, 40 are conducting. This turns off the input current path including the transistors 33, 34, 35. The output signal B of the comparator is adjusted to an L level by the transistors 39, 40. If the signal D carries an H level, the transistor 35 is conducting and the transistors 39, 40 are inoperative. A quadrature-axis current component then flows in the input current path of the transistors 33, 34, 35. The transistor 34 then acts as a resistor. The level of a signal F at the input of the inverter 36 is dependent on the level control of the transistor 33 by the signal A, as can be appreciated from FIG. 3B. If, with the signal A rising, the signal F exceeds the switching threshold TH36 of the inverter 36, the inverters 36, 37, 38 each switch over to their complementary state. H and L levels of signals G, H are at the respective potentials VREF and VSS. These signal levels are converted by the level converter 31 to H and L levels for the respective potentials VDD and VSS. The inverters 36, 37, 38 and the level converter 31 effect an amplification of the signal F. The switching threshold TH1 of the comparator 6 can be adjusted by means of the dimensioning of the switching thresholds TH36, TH37 with respect to the signal F.

Figure 4:
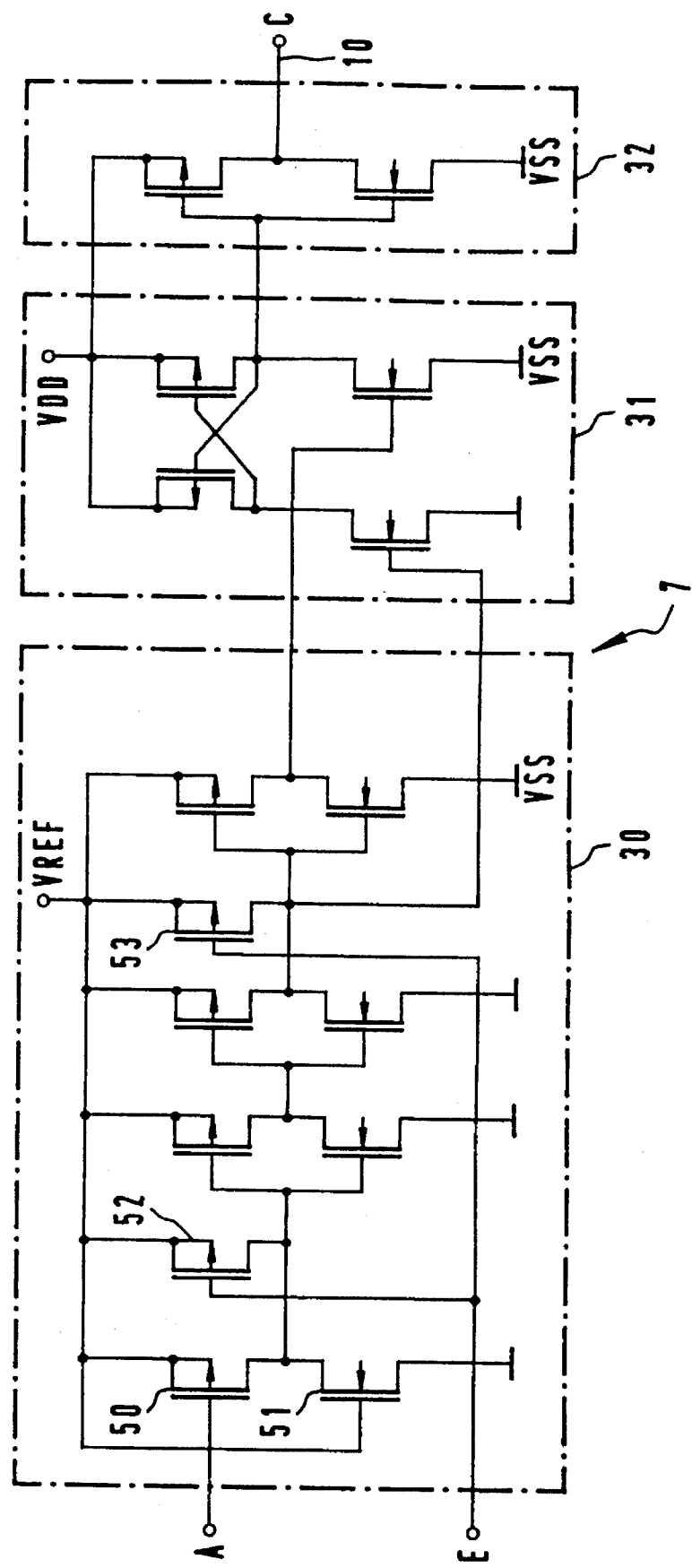
FIG. 4 is a schematic circuit diagram of a second comparator.

The comparator 7 has a reduced power consumption, in comparison with the comparator 6. It cannot be turned off, but it can be reset by the signal E. The circuitry embodiment of the comparator 7 in FIG. 4 is essentially equivalent to the circuit of FIG. 3a, but the input current path of the comparison stage 30 includes only first and second n-channel MOS transistors 50, 51 which are connected in series by their drain-to-source paths. The transistor 50, which is connected by its drain terminal to the reference potential VREF, is controlled by the signal A, and the transistor 51, which is connected to the reference potential side, acts as a resistor. This current path cannot be turned off. A low power consumption by means of a low quadrature-axis current component is attained by the corresponding dimensioning of the transistors 50, 51. Through the use of an L level of the signal E, p-channel MOS transistors 52, 53 are controlled to be conducting and connect the corresponding signal lines to the potential VREF. As a result, the signal C at the output 10 of the comparator 7 is reset to an L level. The height of the comparison threshold of the comparator 7 is adjusted in a manner corresponding to that for the comparator 6, by means of the relative dimensioning of the switching thresholds of the inverters being used relative to the output signal of the input current path.

The edge detector 13 is constructed in a manner which is known to one skilled in the art. One suitable embodiment option is shown in FIG. 5. The signal B is carried to an inverter 60 having an output signal which is supplied to a NAND element 62, both through a delay path 61 and undelayed. If an edge of an H level after an L level of the signal B occurs, then a negatively oriented pulse occurs at the output of the NAND element 62, and the length of this pulse is determined essentially by the delay time along the delay path 61. If the edge of the signal B is oriented positively, then the output signal E of the edge detector 13 remains in the state of repose at the H level.

The above discussion relates to a circuit for generating an increased output voltage that is above the supply voltage. It is used, for instance, in DRAM components to trigger the word lines. In the circuit of FIG. 1, a charge pump 2 is therefore triggered as the voltage generator device. The circuit of FIG. 6 includes a p-channel MOS transistor 71 as its voltage generator device 70. A drain-to-source path of the transistor 71 is connected between the supply potential VDD and the storage capacitor 1. The transistor 71 is triggered in the proper phase by the output signal B of the comparator 6 through an inverter 72. The electrode of the capacitor 1 which is the output 3 of the voltage generator circuit carries a voltage A' with respect to reference potential VSS, which is less than the supply voltage VSS, VDD. A load 73 is connected to the output 3 through the switch 5. The load 73 can have both capacitive and resistive load components. This means that with the circuit of FIG. 6, it is also possible to furnish a direct current at the output 3. Such a circuit for generating a reduced voltage is advantageously used to supply circuit units in DRAM components that are supplied with an operating voltage which is below the supply voltage. As a result, the component elements of these circuit portions can be dimensioned for a lower operating voltage. There is also an economy in terms of power loss.

The functional principle of the circuit shown in FIG. 6 is essentially equivalent to that of the circuit of FIG. 1. During the resting phase, the storage capacitor 1 is charged through the p-channel MOS transistor 71 up to the comparison voltage TH1 of the comparator 6. The comparison voltage TH1 of the comparator 6 is then below the supply potential VDD. In the active phase, the load 73 is supplied from the storage capacitor 1 through the switch 5. If the voltage A' at the output 3 drops below the threshold voltage TH1 of the then turned-on comparator 6, the transistor 71 is controlled to be conducting. The requisite charging current flows until such time as the voltage A' has reached the switching threshold of the comparator 6 and the transistor 71 is blocked.

We claim:

1. A voltage generator circuit, comprising:
   a) a storage capacitor with a terminal for pickup of an output voltage;
   b) a voltage generator device to be turned on and off, said voltage generator device having an output being connected to the terminal of said storage capacitor;
   c) a first comparator device to be turned on and off, said first comparator device comparing the output voltage with a first threshold voltage and generating a signal for turning said voltage generator device on and off;
   d) a second comparator device for comparing the output voltage with a second threshold voltage and generating an output signal of said second comparator device with which said first comparator device is turned on and off;

wherein said first comparator device has a shorter signal delay time than said second comparator device; the first threshold voltage is higher than the second threshold voltage; and including an edge detector receiving the output signal of said first comparator device and generating a pulse resetting said second comparator device upon a signal edge turning off said voltage generator device.

2. The voltage generator circuit according to claim 1, including a logical linking member linking the output signal of said second comparator device to a control signal, said logical linking member supplying an output signal turning said first comparator device on and off.

3. The voltage generator circuit according to claim 1, wherein each of said comparator devices respectively includes:
   a) a comparison stage being supplied by a reference potential and a first supply potential;
   b) a level converter device being supplied by the first supply potential and a second supply potential and having an output, said level converter device converting output signal levels of said comparison stage to one of the supply potentials; and
   c) an amplifier stage connected downstream of the output of said level converter device.

4. The voltage generator circuit according to claim 3, wherein said comparison stage includes:
   a) a first n-channel MOS transistor having a source terminal, a drain terminal being connected to the reference potential and a gate terminal being controlled by the output voltage;
   b) a second n-channel MOS transistor having a drain-to-source path being connected between the source terminal of said first n-channel MOS transistor and the first supply potential and having a gate terminal being connected to the reference potential; and
   c) at least one amplifier stage having an input being connected to the source terminal of said first n-channel MOS transistor.

5. The voltage generator circuit according to claim 4, including a p-channel MOS transistor being connected between the input of said amplifier stage and the reference potential, said p-channel MOS transistor having a gate terminal being controlled by a signal for resetting.

6. The voltage generator circuit according to claim 5, including another n-channel MOS transistor connecting said second n-channel MOS transistor of said comparison stage to the first supply potential, said other n-channel MOS transistor having a gate terminal being controlled by a signal for turning said comparator device on and off.

7. The voltage generator circuit according to claim 1, wherein said voltage generator device includes an oscillator to be turned on and off by the signal for turning said voltage generator device on and off and a pump circuit being controlled by said oscillator.

8. The voltage generator circuit according to claim 1, wherein said voltage generator device includes an MOS transistor having a drain-to-source path being connected between a supply potential and the terminal of said storage capacitor and having a gate terminal being controlled by the output signal for turning said voltage generator device on and off.

* * * * *